(12) United States Patent
Heaps et al.

(10) Patent No.: US 8,392,869 B2
(45) Date of Patent: Mar. 5, 2013

(54) SYSTEMS AND METHODS FOR CIRCUIT LIFETIME EVALUATION

(75) Inventors: Timothy L. Heaps, Chatsworth, CA (US); Douglas J. Sheldon, Valencia, CA (US); Paul N. Bowerman, Altadena, CA (US); Chester J. Everline, Pasadena, CA (US); Eddy Shalom, Valencia, CA (US); Robert D. Rasmussen, Monrovia, CA (US)

(73) Assignee: California Institute of Technology, Pasadena, CA (US)

( * ) Notice: Subject to any disclaimer, the term of this patent is extended or adjusted under 35 U.S.C. 154(b) by 0 days.

(21) Appl. No.: 13/161,433

(22) Filed: Jun. 15, 2011

(65) Prior Publication Data

US 2012/0117528 A1  May 10, 2012

Related U.S. Application Data

(60) Provisional application No. 61/355,111, filed on Jun. 15, 2010.

(51) Int. Cl.
*G06F 11/22* (2006.01)
(52) U.S. Cl. ........................................ 716/136; 716/112
(58) Field of Classification Search .................. 716/136, 716/112
See application file for complete search history.

(56) References Cited

U.S. PATENT DOCUMENTS

| 2002/0008252 A1* | 1/2002 | Koike ........................... 257/200 |
| 2008/0005707 A1* | 1/2008 | Papanikolaou et al. ........... 716/4 |
| 2011/0179321 A1* | 7/2011 | Takeuchi ....................... 714/718 |
| 2012/0117528 A1* | 5/2012 | Heaps et al. .................. 716/136 |

* cited by examiner

*Primary Examiner* — Vuthe Siek
*Assistant Examiner* — Mohammed Alam
(74) *Attorney, Agent, or Firm* — Kauth, Pomeroy, Peck & Bailey LLP (57) ABSTRACT

Systems and methods for estimating the lifetime of an electrical system in accordance with embodiments of the invention are disclosed. One embodiment of the invention includes iteratively performing Worst Case Analysis (WCA) on a system design with respect to different system lifetimes using a computer to determine the lifetime at which the worst case performance of the system indicates the system will pass with zero margin or fail within a predetermined margin for error given the environment experienced by the system during its lifetime. In addition, performing WCA on a system with respect to a specific system lifetime includes identifying subcircuits within the system, performing Extreme Value Analysis (EVA) with respect to each subcircuit to determine whether the subcircuit fails EVA for the specific system lifetime, when the subcircuit passes EVA, determining that the subcircuit does not fail WCA for the specified system lifetime, when a subcircuit fails EVA performing at least one additional WCA process that provides a tighter bound on the WCA than EVA to determine whether the subcircuit fails WCA for the specified system lifetime, determining that the system passes WCA with respect to the specific system lifetime when all subcircuits pass WCA, and determining that the system fails WCA when at least one subcircuit fails WCA.

20 Claims, 8 Drawing Sheets

SYSTEMS AND METHODS FOR CIRCUIT LIFETIME EVALUATION

CROSS-REFERENCE TO RELATED APPLICATION

The present invention claims priority under 35 U.S.C. §119(e) to U.S. Provisional Patent Application No. 61/355,111 entitled "Circuit Lifetime Evaluation", filed Jun. 15, 2010, the disclosure of which is incorporated by reference herein in its entirety.

STATEMENT OF FEDERAL SUPPORT

The inventions described herein were made in the performance of work under a NASA contract, and are subject to the provisions of Public Law 96-517 (35 U.S.C. §202) in which the Contractor has elected to retain title.

FIELD OF THE INVENTION

The present invention relates to the evaluation of the lifetime of electrical systems and more specifically to the evaluation of the lifetime of electrical systems using worst case analysis.

BACKGROUND

Worst Case Analysis (WCA) is typically performed to evaluate whether a circuit continues to function properly when subjected to part variations due to environmental extremes including (but not limited to) radiation, temperature, and aging given the possible parameter tolerances associated with the parts in the circuit design. WCA typically involves constructing mathematical models to describe the behavior of the circuit functions and to verify that the circuit performs within specification. There are several different approaches to WCA, but one convenient approach to performing WCA is Extreme Value Analysis (EVA). EVA is usually the least complicated and most conservative approach to WCA. As such, it is a good initial approach. If the circuit passes, then there is very high confidence in the results and the minimum amount of work was required to verify it. If the circuit does not pass, then the design or requirements can be modified or a less conservative, but more difficult, WCA approach can be used.

When performing WCA using the EVA methodology, the parameters of the parts within each (sub)circuit which affect performance are combined such that each environment that drives them to their extrema is simultaneously acting on the part. For example, in a space mission, if an operational amplifier's offset voltage is maximized when temperature is low, radiation is high, and at the end of the mission, then that combination of conditions (minimum temperature, maximum radiation, and end of mission) is assumed in calculating the maximum offset voltage. Usually, parameter changes are multiplied assuming that they are independent influences on the parametric behavior. Thus, to determine the maximum positive fractional variation for a parameter:

$$(1+dP)=(1+dX)(1+dS)(1+dT)(1+dE)(1+dR)$$

where:
dP is the total parametric variation;
dX is the part initial tolerance;
dS is the variation due to aging and drift;
dT is the variation due to temperature (worst-case direction);
dE is the variation due to applied voltage and frequency; and
dR is the variation due to radiation degradation.

If another set of conditions on the aforementioned operational amplifier leads to maximum bias current for that operational amplifier, then those conditions are assumed in calculating the maximum bias current. In general, a Worst Case Database (WCDB) can be generated one time for the parameters of the parts to be used on all the subsequent EVAs.

In many applications, two sets of WCAs are performed, or at least considered; one for conditions with the circuit powered (i.e., biased) and one for conditions when the circuit is unpowered (i.e., unbiased). Since radiation degradation for some parts is worse unbiased, that case must be considered. Redundancy is of no value, if a circuit will not turn on when it is eventually needed. Alternatively, the variations in the WCDB may include the worse of biased and unbiased performance, and the analyst would not have to consider biased/unbiased differences.

Considering the extreme radiation environment that can be experienced in many applications and the additional part parameter variations that can result from high radiation, it is likely that many circuits or portions of circuits designed for such applications will not pass EVA. If the circuit does not pass, then the design can be modified or a less conservative, but more difficult, WCA approach can be used; for example, temperature tracking is often tried as a modification to EVA to attempt to "sharpen the pencil" and get a WCA to pass. The intent in doing a different approach is to more accurately assess the margins in the design even though more work is required. WCA should always be a rigorous (i.e., conservative) assessment of the circuit's expected performance; the intent should not be to get around the process in order to just get the analysis to pass.

SUMMARY OF THE INVENTION

Systems and methods for determining the lifetime of circuits in accordance with embodiments of the invention are disclosed. In many embodiments, Circuit Lifetime Assessment (CLA) is performed to estimate the lifetime of a system. CLA involves iteratively performing WCA until a lifetime is identified at which the worst case analysis (WCA) predicts the system will just barely fail or will pass with zero margin. Due to the conservative nature of Extreme Value Analysis (EVA), when circuits fail EVA additional WCA techniques can be applied to assess the circuit that eliminate some of the conservative assumptions imposed in EVA. These additional techniques more accurately determine the margin, or assess the risk, in the designs relative to their required applications.

One embodiment of the invention includes iteratively performing Worst Case Analysis (WCA) on a system design with respect to different system lifetimes using a computer to determine the lifetime at which the worst case performance of the system indicates the system will pass with zero margin or fail within a predetermined margin for error given the environment experienced by the system during its lifetime. In addition, performing WCA on a system with respect to a specific system lifetime includes identifying subcircuits within the system, performing Extreme Value Analysis (EVA) with respect to each subcircuit to determine whether the subcircuit fails EVA for the specific system lifetime, when the subcircuit passes EVA, determining that the subcircuit does not fail WCA for the specified system lifetime, when a subcircuit fails EVA performing at least one additional WCA process that provides a tighter bound on the WCA than EVA to determine whether the subcircuit fails WCA for the specified system lifetime, determining that the system passes WCA with respect to the specific system lifetime when all subcircuits pass WCA, and determining that the system fails WCA when at least one subcircuit fails WCA.

In a further embodiment, performing at least one additional WCA process that provides a tighter bound on the WCA than EVA to determine whether the subcircuit fails WCA for the specified system lifetime comprises performing Refined Worst Case Analysis (Refined WCA) with respect to the subcircuit and the specified system lifetime.

In another embodiment, performing Refined WCA with respect to the system and the specified system lifetime involves performing at least one of measuring the actual range of part parameter values for at least one lot of parts that are included in the system, measuring the values of the actual parts used in the system, or analyzing the thermal gradient within the system to determine whether the same extreme temperature limit should be applied to each part.

A still further embodiment includes applying root sum squares (RSS) to random circuit parameters.

In still another embodiment, performing at least one additional WCA process that provides a tighter bound on the WCA than EVA to determine whether the subcircuit fails WCA for the specified system lifetime comprises performing Monte Carlo Worst Case Analysis (Monte Carlo WCA) with respect to the subcircuit and the specified system lifetime.

In a yet further embodiment, performing Monte Carlo WCA with respect to the system and the specified system lifetime includes determining a probability density function (PDF) for the performance of at least one part within a subcircuit given the environment experienced by the subcircuit during its lifetime, determining extreme part parameters for the at least one part based upon the PDF for the part, and performing WCA of the subcircuit based upon the extreme part parameters for at least one of the parts within the subcircuit.

In yet another embodiment, the PDF for a part's performance is generated by selecting random values based upon PDFs of environmental parameters at the point in the operational life of the circuit for which the reliability estimate is desired.

In a further embodiment again, performing at least one additional WCA process that provides a tighter bound on the WCA than EVA to determine whether the subcircuit fails WCA for the specified system lifetime comprises performing Reliability Quantification with respect to the subcircuit and the specified system lifetime.

In another embodiment again, performing Reliability Quantification with respect to the system and the specified system lifetime includes determining a PDF for subcircuit performance by randomly sampling the PDFs of environmental parameters at the point in the operational life of the circuit for which the reliability estimate is desired and from derived PDFs for the part parameters, and determining subcircuit performance based upon the PDF for the subcircuit.

In a further additional embodiment, performing at least one additional WCA process that provides a tighter bound on the WCA than EVA to determine whether the subcircuit fails WCA for the specified system lifetime includes performing Refined WCA with respect to the subcircuit and the specified system lifetime, when the subcircuit passes Refined WCA, determining that the subcircuit does not fail WCA for the specified system lifetime, and when a subcircuit fails Refined WCA performing at least one additional WCA process that provides a tighter bound on the WCA than Refined WCA to determine whether the subcircuit fails WCA for the specified system lifetime.

In another additional embodiment, performing at least one additional WCA process that provides a tighter bound on the WCA than Refined WCA to determine whether the subcircuit fails WCA for the specified system lifetime includes performing Monte Carlo WCA with respect to the subcircuit and the specified system lifetime, when the subcircuit passes Monte Carlo WCA, determining that the subcircuit does not fail WCA for the specified system lifetime; and when a subcircuit fails Monte Carlo WCA performing at least one additional WCA process that provides a tighter bound on the WCA than Monte Carlo WCA to determine whether the subcircuit fails WCA for the specified system lifetime.

In a still yet further embodiment, performing at least one additional WCA process that provides a tighter bound on the WCA than Monte Carlo WCA to determine whether the subcircuit fails WCA for the specified system lifetime includes performing Reliability Quantification with respect to the subcircuit and the specified system lifetime, when the subcircuit passes Reliability Quantification, determining that the subcircuit does not fail WCA for the specified system lifetime, and when a subcircuit fails Reliability Quantification determining that the subcircuit fails WCA for the specified system lifetime.

In still yet another embodiment, performing WCA on a system with respect to a specific system lifetime further includes obtaining part information with respect of the parts within the system and the scenario of the system.

In a still further embodiment again, the information concerning the operating scenario of the system includes information concerning the environment experienced by the circuit during its lifetime.

In still another embodiment again, WCA considers at least one parameter selected from the group consisting of aging, radiation, temperature, initial tolerance, bias, and annealing.

A still further additional embodiment also includes identifying at least one subcircuit that limits the system lifetime.

In still another additional embodiment, identifying at least one subcircuit that limits the circuit lifetime includes selecting each subcircuit and holding the function of the subcircuit constant while the other subcircuits can vary, iteratively performing Worst Case Analysis (WCA) with respect to different system lifetimes using a computer to determine the lifetime at which the worst case performance of the system indicates the system will pass with zero margin or fail within a predetermined margin for error given the environment experienced by the system during its lifetime, and identifying at least one subcircuit that limits the system lifetime based upon the increase in system lifetime that occurs when the subcircuit is assumed not to fail.

A yet further embodiment again also includes identifying at least one part within the subcircuit that limits the subcircuit lifetime.

Yet another embodiment again, also includes identifying at least one part parameter with respect to a specific part in the subcircuit that limits the subcircuit lifetime.

Another further embodiment includes a computer configured to iteratively perform Worst Case Analysis (WCA) on a system design with respect to different system lifetimes to determine the lifetime at which the worst case performance of the system indicates the system will pass with zero margin or fail within a predetermined margin for error given the environment experienced by the system during its lifetime. In addition, performing WCA on a system with respect to a specific system lifetime includes identifying subcircuits within the system, performing Extreme Value Analysis (EVA) with respect to each subcircuit to determine whether the subcircuit fails EVA for the specific system lifetime, when the subcircuit passes EVA, determining that the subcircuit does not fail WCA for the specified system lifetime, when a subcircuit fails EVA performing at least one additional WCA process that provides a tighter bound on the WCA than EVA to determine whether the subcircuit fails WCA for the specified system lifetime, determining that the system passes WCA with respect to the specific system lifetime when all subcircuits pass WCA, and determining that the system fails WCA when at least one subcircuit fails WCA.

DETAILED DESCRIPTION

Turning now to the drawings, systems and methods for estimating the lifetime of an electrical system in accordance with embodiments of the invention are illustrated. In many embodiments, a circuit lifetime assessment (CLA) is performed to determine the point at which a circuit has zero margin with respect to its requirement(s). The CLA involves repeatedly performing Worst Case Analysis (WCA) on a system to determine the lifetime at which (within a margin for error) the worst case performance indicates the system will just barely fail or pass with zero margin. In several embodiments, the parts that provide the greatest impact on circuit lifetime are also identified. In a number of embodiments, the factors or part parameters that create the risk that the part will fail and impact system lifetime are also identified. The information concerning the parts that have the greatest influence on system lifetime and/or the factors that create the risk the part will fail and impact system lifetime can be utilized to redesign aspects of the system to improve the estimated lifetime of the system.

In many embodiments, the simulations performed during CLA simulate variations in part performance due to aging, radiation (including ELDRS), temperature, initial tolerance, bias, annealing, and any other relevant phenomena. This information can be useful in understanding how much margin a design has in comparison to the requirements of a specific application, how components of each design are limiting its life, where trades should be made to improve circuit and system life, and how to employ resources (such as shielding) most effectively to extend system life.

In a number of embodiments, a variety of WCA techniques are used to simulate circuit performance. In several embodiments, an assessment of whether a circuit will fail is performed using multiple techniques having increased complexity and lower margins. In this way, a more accurate assessment of whether the circuit will fail to meet operational requirements during a specified operational lifetime can be obtained alleviating the necessity of over engineering the system in order to meet certain operational objectives. In many embodiments, analysis is performed using a combination of deterministic and probabilistic WCA approaches. The performance of CLA and the WCA techniques that can be performed during CLA are discussed further below.

System Lifetime Evaluation

Figure 1:
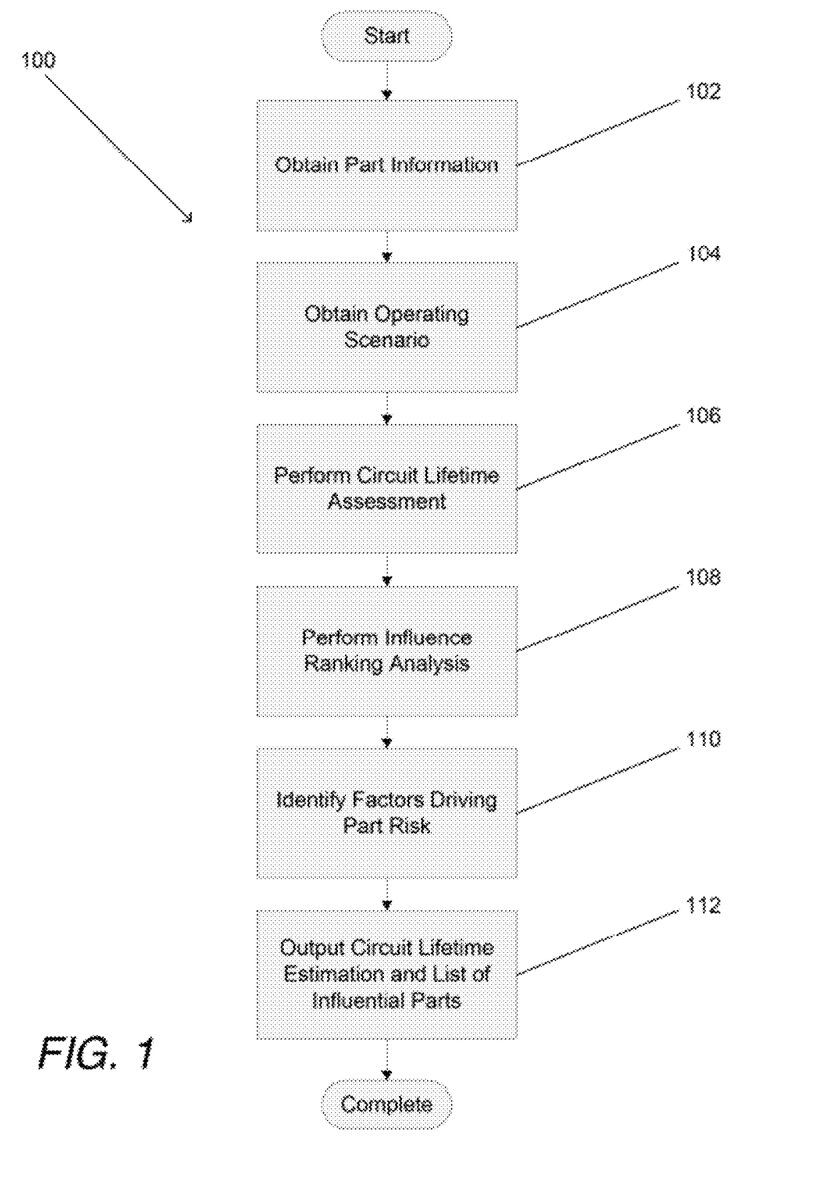
FIG. 1 is a flow chart illustrating a process for performing system lifetime evaluation in accordance with an embodiment of the invention.

A process for evaluating the lifetime of a system in accordance with an embodiment of the invention is illustrated in FIG. 1. The process 100 involves obtaining part information 102 with respect to each of the parts within the system and the operating scenario of the system (i.e. the requirements of the system for the specific application). The information with respect to the parts typically can be any information that can be utilized in an WCA process, and the information concerning the operating scenario typically includes a circuit lifetime, and a description of the environment experienced by the circuit during its lifetime including (but not limited to) radiation (including ELDRS), temperature, initial tolerance, bias, annealing, and any other relevant phenomena. A CLA can then be performed (106) on the system to determine the lifetime at which WCA predicts the system will fail. As part of the process, an Influence Ranking Analysis can also be performed (108) on each of the parts. Performing Influence Ranking Analysis involves identifying the parts that have the greatest influence over the lifetime of the system. In several embodiments, the Influence Ranking Analysis can also involve identifying (110) the specific factors or part parameters that cause the part to increase the risk of system failure. Once the CLA and the Influence Ranking Analysis is complete, the process outputs (112) the circuit lifetime estimation and the details of the parts and/or part parameters that influence the circuit lifetime. Processes for performing CLA and Influence Ranking Analysis in accordance with embodiments of the invention are discussed further below.

Circuit Lifetime Assessment (CLA)

CLA is performed to determine the point at which a circuit has zero margin with respect to its operational requirement(s). If there are several requirements imposed on the circuit, then the driving requirement determines the life of the circuit. CLA results can be used to compare circuit lifetimes to determine where design changes, requirement changes, or other activities may be warranted to extend the overall life of the design. CLA can also be repeated varying the requirements, shielding, temperature, or operational usage to determine their impact on lifetime.

CLA involves repeatedly performing WCA on a system with respect to one or more environmental parameters (e.g. radiation exposure) to determine the point at which there is practically zero margin with respect to worst case performance of the system. As noted above, when performing WCA using EVA, the large margins built into EVA may be responsible for circuits or portions of circuits failing EVA. In many embodiments, the WCA performed using CLA also utilizes additional WCA techniques that provide tighter bounds on the WCA when a circuit or subcircuit fails EVA. In this way, the CLA is able to provide a much tighter bound on the circuit lifetime predicted using WCA. Various WCA techniques that can be utilized during CLA in accordance with embodiments of the invention are discussed further below.

During CLA, if the result of the initial WCA analysis is that the requirement is not met, then the system can be simulated using a shorter lifetime. If the result is that there is positive margin with respect to the requirement, then the system can be simulated using a longer lifetime. Once two bounding system lifetimes are set (one at which the system requirements are met and the other at which it fails), then the point with zero margin (within some acceptable error) can be honed in upon by repeated analyses. As noted above, WCA provides a lower bound on circuit lifetime and the more precise the WCA analysis the closer the system lifetime obtained through CLA will be to the true circuit lifetime.

In many embodiments, the honing in process utilized during CLA is a simple binary search cutting each successive pass-fail interval in half or by interpolating the intermediate value based on the prior pass-fail limits and the margin with respect to the circuit requirement being assessed at those two points. If a circuit has multiple requirements levied against it, then the overall lifetime of the circuit would be the least of the lifetimes assessed for the various requirements.

Figure 2:
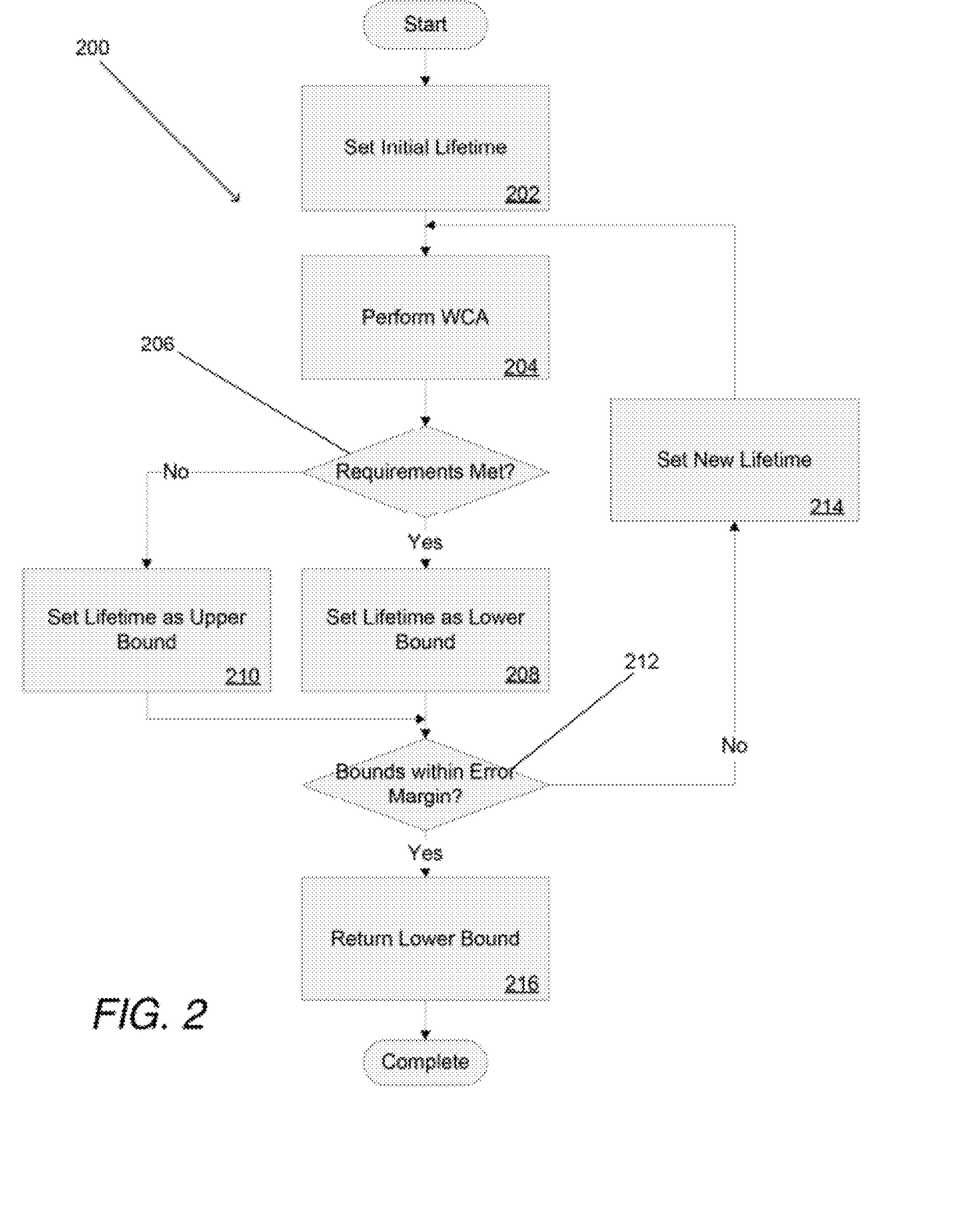
FIG. 2 is a flow chart illustrating a process for performing Circuit Lifetime Assessment (CLA) in accordance with an embodiment of the invention.
Figure 3A:
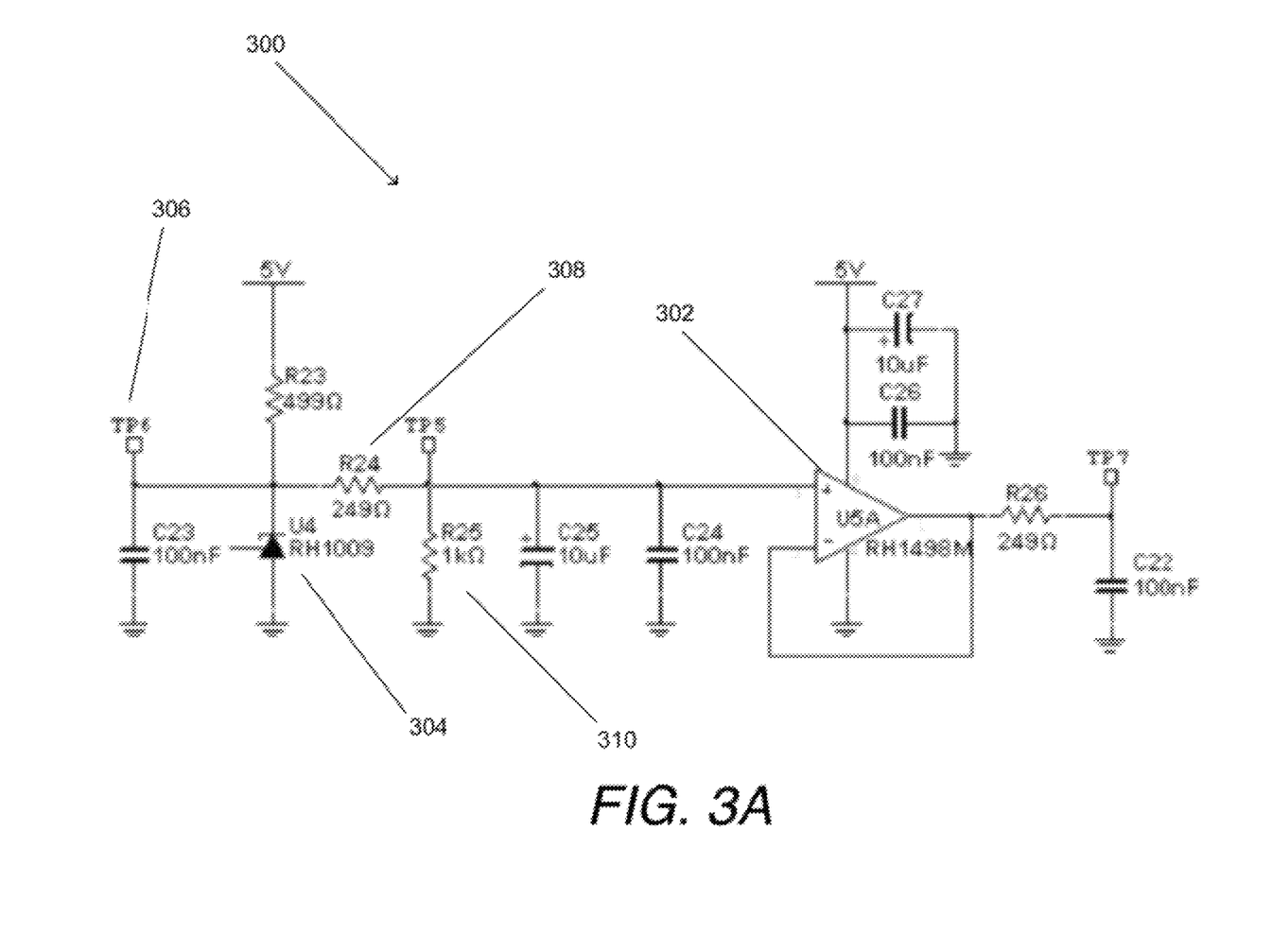
FIGS. 3A-3C illustrate the results of Influence Ranking Analysis performed upon the circuit illustrated in FIG. 3A in accordance with an embodiment of the invention.
Figure 3B:
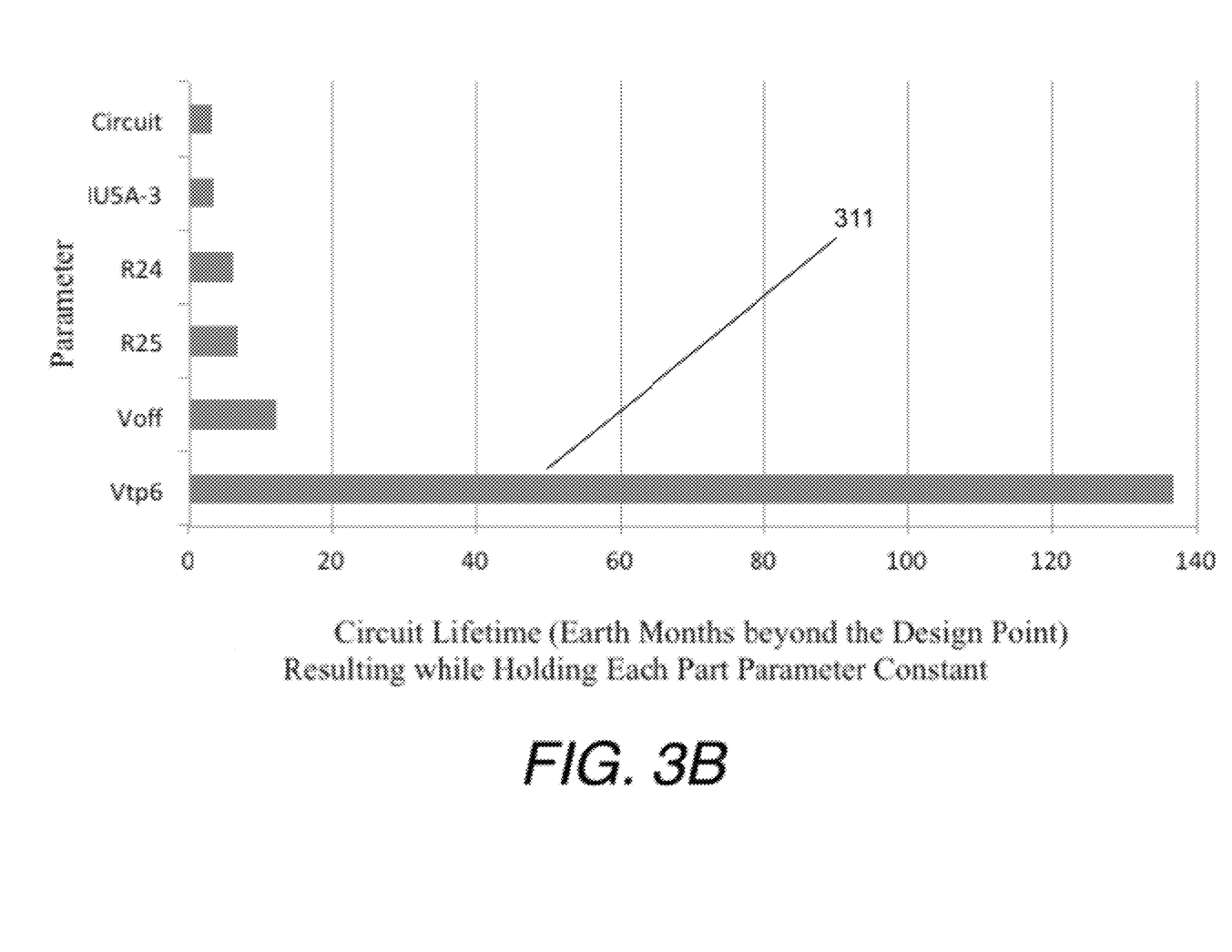
Figure 3C:
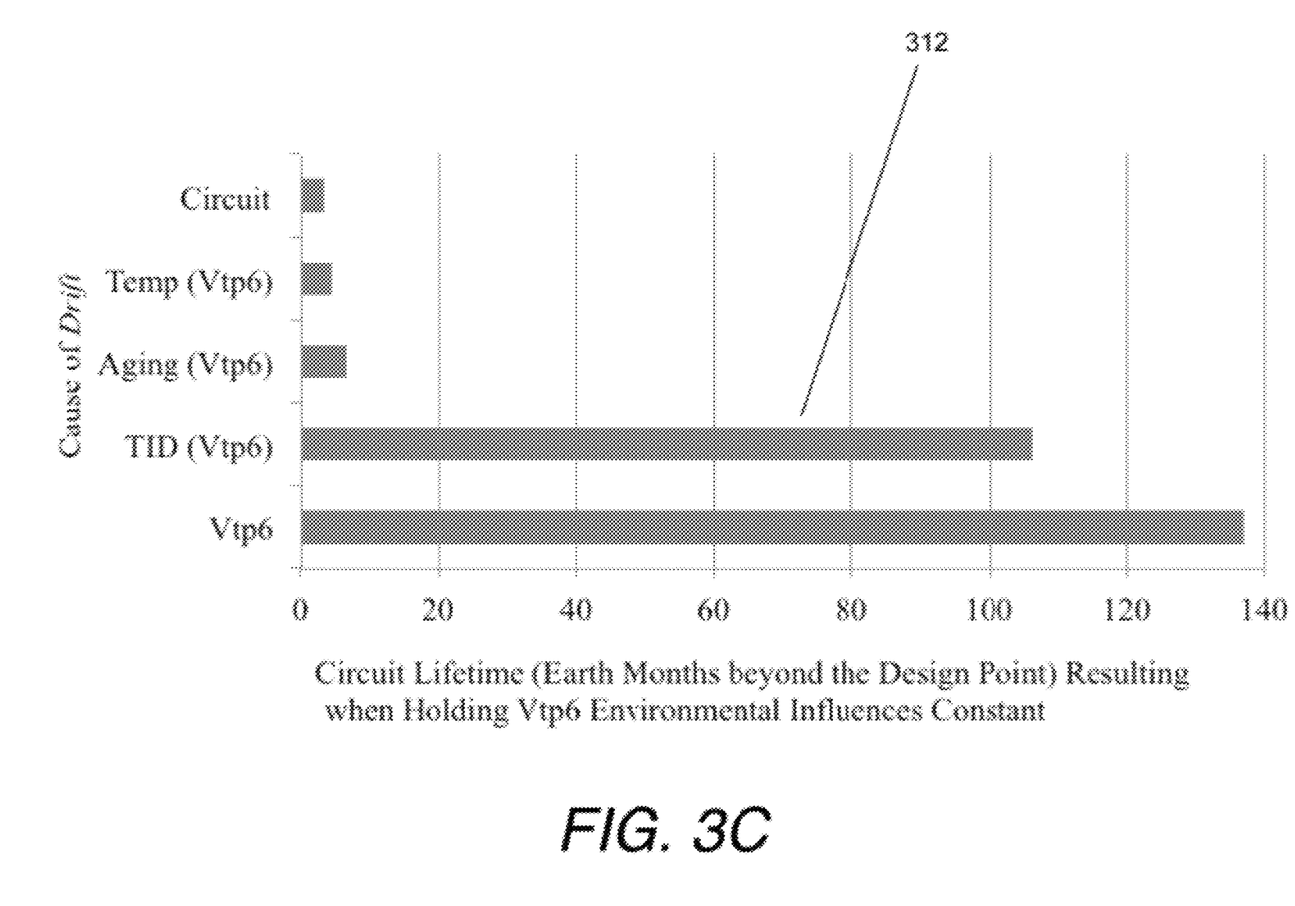

A process for performing CLA in accordance with an embodiment of the invention is illustrated in FIG. 2. The process 200 involves setting (202) an initial lifetime (often the anticipated minimum system lifetime for a specific application) and then performing (204) WCA to determine (206) whether the system requirements are met over the lifetime under WCA. If the requirements are met, then the system lifetime is set (208) as the new lower bound on the system lifetime. If the requirements are not met, then the system lifetime is set (210) as the new upper bound on the system lifetime. A new system lifetime can be selected (214) using (but not limited to) any of the techniques discussed above, and the process of performing (204) WCA repeated until a determination (212) is made that the upper and lower bounds on the system lifetime under WCA are sufficiently close that the lower bound constitutes as accurate estimate of how long the system will continue to function within specification. At which point, the lower bound is returned (216) as the system lifetime. Although a specific process is illustrated in FIG. 2, any of a variety of processes utilizing WCA can be utilized to obtain an estimate of system lifetime using CLA in accordance with embodiments of the invention.

The process described above for determining the point of zero margin is called Circuit Lifetime Assessment (CLA) because it yields an estimate of how long the system will continue to function within specification. It should be noted that the CLA estimate does not address life-limiting issues outside of the realm of WCA like random failures or failures due to single event effects. So, the life estimate from the analysis may not necessarily be less than the actual life of the circuit if other factors not analyzed come into play or if, of course, erroneous assumptions are made in the analysis.

Based on the results of the CLA, circuits within the system can be ranked according to their lifetimes, and system level trades can be made to improve the lifetimes of the limiting circuits (possibly to the detriment of the longest lived circuits). Examples of trades can include (but are not limited to) reducing radiation shielding from long-lived circuits and adding that shielding to short-lived circuits. Performing Influence Ranking Analysis to identify circuits and/or parts that heavily impact circuit lifetime and the specific characteristics of the circuits and/or parts that increase the risk of failure are discussed further below.

Influence Ranking Analysis

The end result of the CLA is an estimate of a minimum value for the lifetime of the circuit analyzed. In many embodiments, a lifetime estimate is obtained for each circuit in an assembly and a determination is made concerning which is the life limiting circuit of the assembly. In the context of space missions, if an assembly's life limit is small relative to other assemblies on the spacecraft (and if that circuit is desired or needed for the entire mission), then it is worthwhile further investigating, i.e., to perform a sensitivity analysis of, the circuit to understand what contributes to its unreliability.

In several embodiments an influence ranking analysis is performed on a circuit by reassessing the lifetime of the circuit for each of the parts and/or part parameters in the circuit, holding the function of the part and/or the part parameter constant during the evaluation while allowing all the other parts to vary. If the circuit lifetime becomes much longer, then that part and/or part parameter has a large influence on the lifetime. If the circuit lifetime does not change significantly, then that part and/or part parameter has little influence on the circuit lifetime. When the change in circuit lifetime has been calculated for each of the parts and/or parameters that influence the circuit lifetime, the resulting lifetimes can be compared to determine which parts and/or part parameter(s) had the greatest influence on circuit lifetime. In a number of embodiments, the most influential parts are identified and then the part parameters of the most influential parts are analyzed to determine the part parameters that have the greatest impact on circuit lifetime.

In order to illustrate the manner in which part parameters are analyzed, the life sensitivity of a sample circuit shown in FIG. 2A when various part parameters are held constant is illustrated in FIG. 2B. In the chart shown in FIG. 2B, IU5A-3 is the bias current of the operational amplifier 202 in the sample circuit 200 shown in FIG. 2A, Voff is the operational amplifier offset voltage, and Vtp6 is the 2.5 reference voltage established by the RH1009. Referring to FIG. 2B, the life of the circuit is dominated by the performance of the RH1009 shunt regulator diode (204), which generates the 2.5V reference at test point TP6 (206) and is indicated as Vtp6 (211) in the chart. The other parts of the circuit, including resistors R24 (208) and R25 (210), had little effect on the circuit lifetime. As a result of this information, design changes should focus on the 2.5V reference voltage. For example, a more accurate part can be used or the circuit could be redesigned to be less sensitive to the failure of the RH1009 regulator diode (204).

As noted above, the specific part parameters that lead to the risk of failure can be analyzed as part of the system lifetime evaluation. The chart shown in FIG. 2C illustrates the analysis of the environmental factors that shorten circuit lifetime. The analysis is accomplished by repeating the CLA holding each of the environmental functions constant. The chart illustrates that radiation (i.e. total ionizing dose 212) is by far the dominant contributor to life degradation. This knowledge can assist in the redesign of the circuit to extend the lifetime of the circuit.

Performing WCA

The accuracy with which CLA can determine circuit lifetime depends upon the accuracy of the WCA technique used to assess a circuit's performance under a given set of environmental conditions. A variety of WCA analysis techniques that can be utilized to assess a circuit's performance are discussed below. As a general rule, the accuracy with which an approach bounds the lifetime of the circuit increases with the complexity of the approach. Accordingly, in many embodiments, a combination of approaches is utilized where the complexity of the assessment increases each time a circuit or subcircuit fails a less complex WCA assessment technique until a final determination is made concerning whether the circuit or subcircuit is capable of meeting its operational requirements.

Both deterministic and probabilistic WCA approaches can be used to determine the margins and/or risks associated with circuit designs meeting their specified requirements. Deterministic WCA approaches include (but are not limited to) EVA and Refined WCA. Refined WCA is a technique that eliminates some of the conservatism that is built into the EVA process. Additionally, probabilistic WCA techniques can be utilized to further reduce the margins utilized in EVA. Such probabilistic techniques include (but are not limited to) two new techniques that can be referred to as Monte Carlo WCA, and Reliability Quantification. For probabilistic techniques, it is expected that the assessment needs to be repeated for many different points in time to generate an approximate curve of reliability versus time. Without probabilistic WCA techniques, a purely deterministic WCA can lack the ability to assess the impact of redundancy (e.g., two redundant circuits will be predicted fail at the same time using EVA or refined WCA techniques) and reliability margins in problematic risk drivers (e.g., circuits whose reliability is difficult to enhance because harder parts are unavailable and added shielding is not an option). Although each of the specific WCA techniques referenced above are discussed below, any WCA technique can be utilized in CLA as appropriate to the requirements of a specific application in accordance with an embodiment of the invention.

Extreme Value Analysis (EVA)

One of the simplest WCA approaches that can be used to assess the ability of a circuit to meet its requirements is EVA. The EVA process begins by dividing the circuit into manageable subcircuits and assigning derived requirements to their functions. Mathematical models of those subcircuits are generated as a function of the part parameters that affect its performance. The theoretical limits for the part parameters are determined at the environmental limits specified for the application (e.g. temperature, total dose radiation, and age) and the specified limits of initial tolerance. Sensitivity analysis is applied to the mathematical model(s) of each subcircuit being analyzed to determine which set of part parameter extremes drives it to its most extreme result with respect to its performance limits. Then the models are assessed by applying the part performance parameter values in the combinations determined to produce the most extreme results (e.g., maximum or minimum) in the function being analyzed. Finally, these results are compared with the specified and derived requirements for the subcircuit to assess if the requirements are met. The EVA process may result in impossible conditions being assumed for the circuits and subcircuits being analyzed (for example, two different part parameters from a single part driving a circuit's performance to its maximum state may result from the part being simultaneously at opposite temperature extremes).

It should be noted that EVA, as well as derivative methods like Refined WCA, assumes that the extrema in circuit performance occurs at some combination of the extremes of the performance of the part parameters. That is not necessarily the case, especially when dynamic behaviors are involved. In many embodiments, a prerequisite to accepting EVA or Refined WCA for a given circuit is to eliminate such possibilities.

Refined WCA

Refined WCA provides a process to, albeit with additional work, demonstrate that circuits can perform within requirements given circuit and environmental conditions that would otherwise exclude the design by the EVA process. The goal of Refined WCA is to provide estimates of circuit performance that still bound the actual performance in use but which are less conservative than those estimates provided by EVA. Refined WCA involves effort to eliminate conservatism in the WCA process, but still yields a conservative result. Specifically, conservatism is reduced by looking at the actual parameters and environment anticipated to be experienced by each part in the circuit. Examples of ways in which conservatism in an EVA analysis can be eliminated are discussed below.

A reduction in the margins allowed for in EVA can be achieved by measuring the actual range of part parameter values for the lots of parts that are included in the system. This can reduce the initial tolerances assumed for the parts being used in the EVA. Additionally, the actual part values can be measured to reduce the tolerance range to the uncertainty in the measurement.

Further reductions in conservatism can be utilized by analyzing the thermal gradient within a system to determine whether the same extreme temperature limit should be applied to each part. EVA sensitivity analysis is still used to determine the relative value of the part parameters; the difference in temperature is constrained to the limit of the thermal gradient. For many parts, the limit of the thermal gradient across a circuit board may be less extreme than the temperatures used in EVA. Conservatism in the EVA can also be reduced by considering only the system allowable operating temperature range at the thermal control surface (plus any temperature rise due to power dissipated across the circuit board).

A root sum square (RSS) can be applied to models, where it is determined that the parameters that are being combined are each highly improbable limits of independent random variations (biases are separately added in algebraically). In theory, parameters combined by RSS should all be from the same underlying distribution. In many embodiments, RSS may not be an acceptable alternative in WCA. It is presumed that in almost all cases EVA is performed prior to Refined WCA and that the models from that effort have already been created. If a circuit fails EVA, then an assessment of the risk drivers can be made. These risk drivers can then be used to determine how best to manage the risk. If the decision is to proceed with a Refined WCA, only then should that process be applied. If a circuit fails Refined WCA, the risk drivers again should be identified, and consideration given to RSS.

The steps, or refinements, outlined above can be applied singly (as might happen if the EVA was very close to passing the requirements) or all together. If many of the steps are applied simultaneously, it seems logical to bundle all of the steps that focus on changes to the part parameter inputs. With the exception of RSS of random circuit parameters, all of the refinements above only change the underlying part parameter values that are applied to the circuit model. Hence, the easiest approach for an analysis where more than minor improvement over the EVA results are attempted in order to meet requirements is to make all those changes that impact the part parameter values and rerun the circuit model. If the circuit still fails, then RSS of random circuit level parameters can be applied as a final step.

Monte Carlo WCA

A Monte Carlo based WCA method has been developed in accordance with embodiments of the invention, which takes into account the actual distributions of the environmental parameters in which the parts and circuit operates. The distribution of these values determines part parameter extremes to be used in the WCA, which in turn will estimate the distribution of the required circuit performance criteria. In this Monte Carlo approach two distributions are generated; one based on the part parameters that force the circuit to its minimum operational limit and one for the maximum limit. As is discussed further below, circuits that cannot meet their requirements using Refined WCA can be subjected to this Monte Carlo method.

In many embodiments, Monte Carlo WCA employs probability density functions (PDFs) associated with the thermal and radiation environments along with deterministic part parameter and circuit information to calculate PDFs for a circuit's performance with respect to its requirements. In this case, random values are selected for the environmental parameters based on their PDFs at the point in the operational life of the circuit for which the reliability estimate is desired. The extreme part parameters associated with the selected environments are calculated. Then the circuit is assessed for worst case performance based on that set of part parameters. Estimates of the PDFs for the circuit performance can be generated by sufficiently large numbers of Monte Carlo simulations. The area under the tails of the estimated PDF for the circuit performance that is outside of its required performance is a measure of its unreliability.

Reliability Quantification

A Reliability Quantification method has also been developed in accordance with embodiments of the invention to include the distributions associated with part parameters as well as with the operating environment. Reliability Quantification is an extension of Monte Carlo WCA by which random samples are drawn from the distributions of the environmental parameters and then from derived distributions for part parameters to generate more realistic distributions for actual circuit performance.

Reliability Quantification employs PDFs associated with the part parameters to gain an even more accurate PDF of circuit performance. For each Monte Carlo simulation, random values are selected for the environmental parameters at the time of interest. Then, based on those selections, PDFs for the part parameters that affect the circuit performance are generated, and random selections for the part parameters are chosen. The circuit is assessed for its performance for one data point in the development of its PDF. The process is repeated (starting with random values for the environmental parameters) a sufficiently large number of times to create the PDF for the circuit. Again, the area under the tails of the circuit performance PDF that is outside of the expected performance for the circuit is a measure of its unreliability. Given good inputs, proper modeling, and sufficient simulation samples, Reliability Quantification should result in an accurate estimate of the circuit reliability. In many embodiments, due to the increased complexity of Reliability Quantification, it is only used on circuits that fail to meet some specified reliability criteria using the Monte Carlo WCA method.

Order of Analysis

Figure 4:
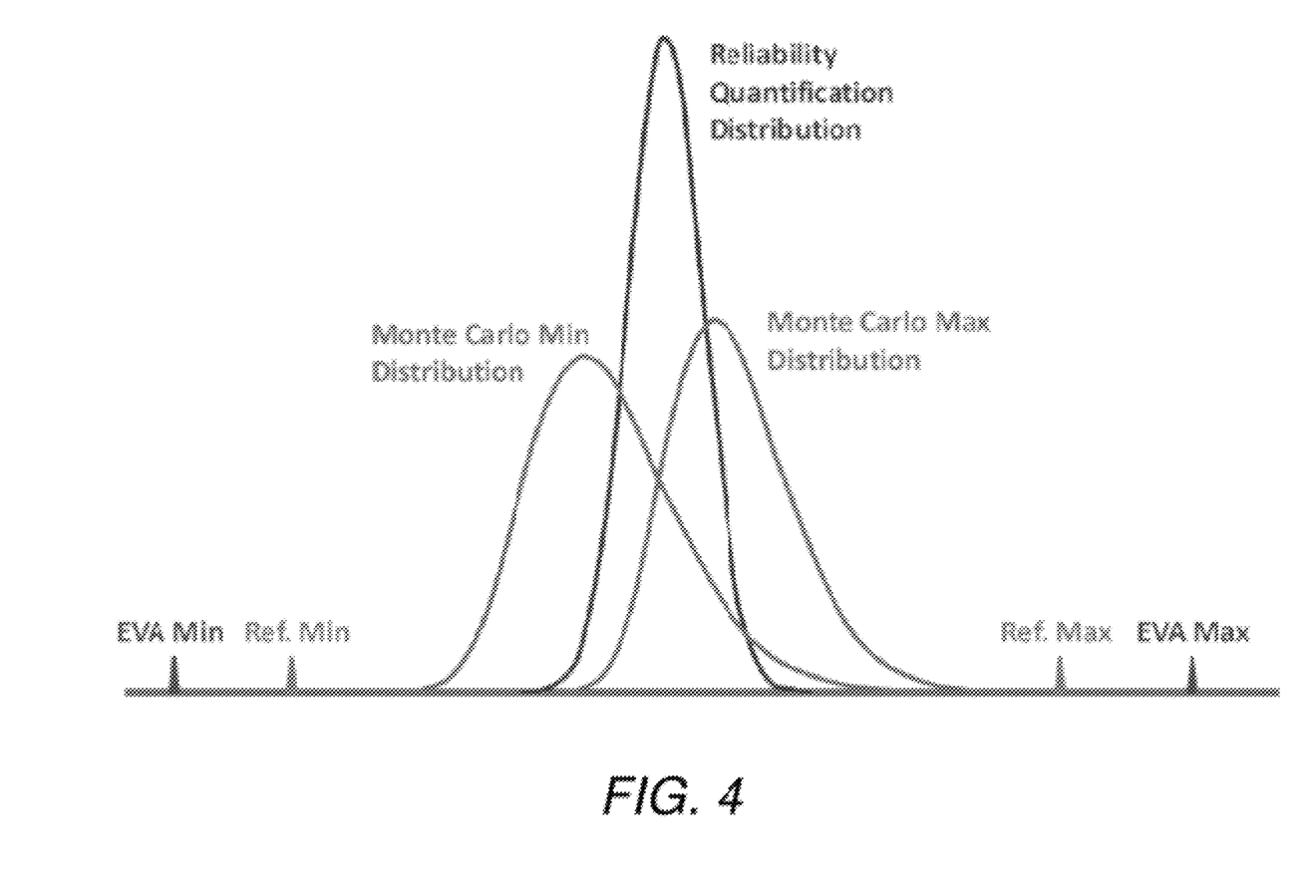
FIG. 4 is a chart illustrating a comparison of the Extreme Value Analysis, Refined Worst Case Analysis (WCA), Monte Carlo WCA, and Reliability Quantification methods that can be utilized in WCA processes in accordance with embodiments of the invention.

A comparison of the four methods described above is conceptually illustrated in FIG. 4. The EVA results envelop the Refined WCA results. The tails from the distribution from the Monte Carlo WCA analysis are bounded by the Refined WCA, and the minimum and maximum tails from the Monte Carlo WCA distributions bound the distribution from the Reliability Quantification. Although Reliability Quantification provides the most accurate assessment of a circuit's performance, it is also expected to be a very time consuming analysis. The intent with these different approaches is to try the quickest approach first, i.e., EVA, to screen out circuits that are acceptable at that level. Then increasingly more complex WCA assessments can be made until a determination is made that the circuit is acceptable or the circuit is determined to fail to meet its operational requirements using the most accurate technique.

Figure 5A:
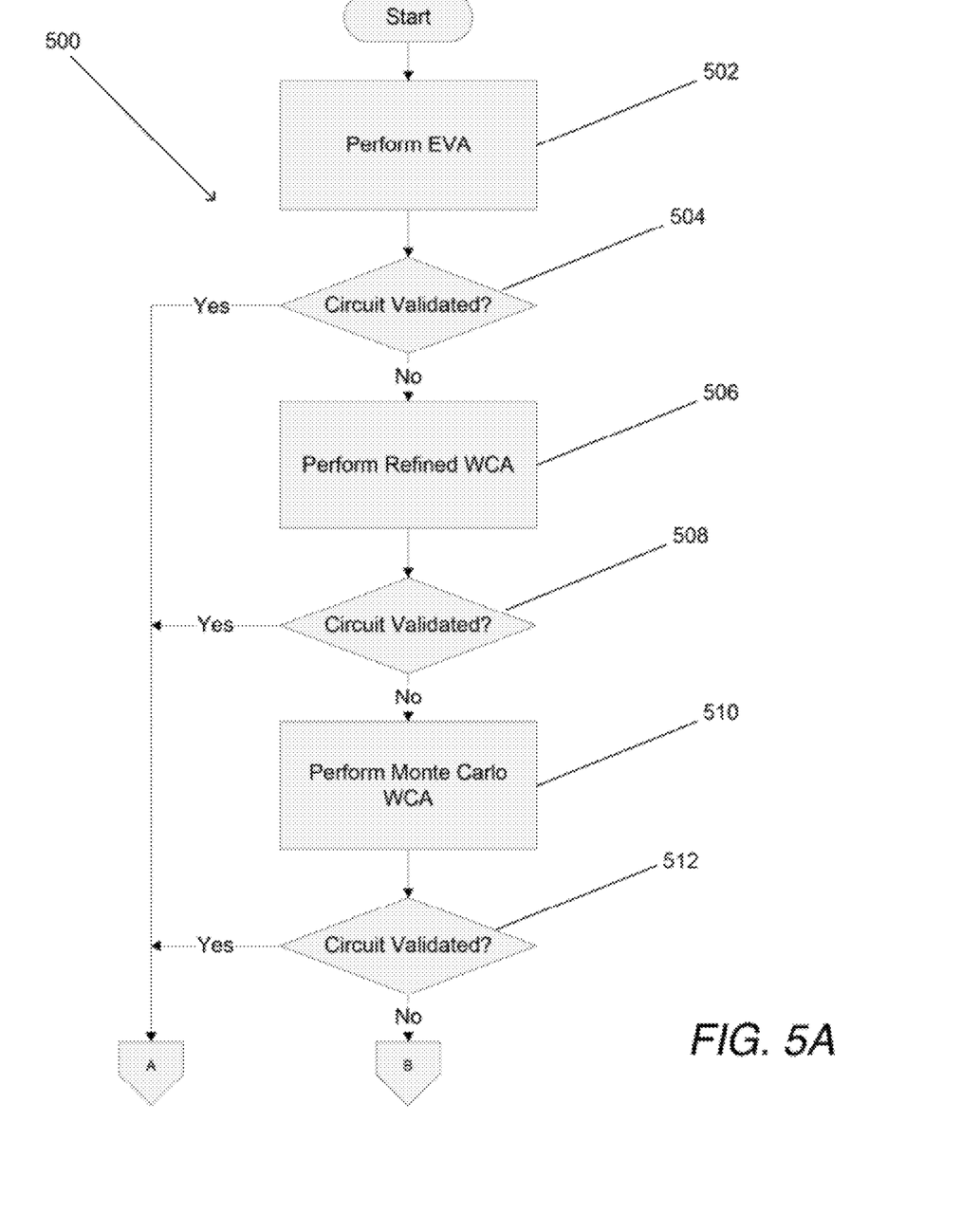
FIGS. 5A and 5B show a flow chart illustrating a process for performing WCA by applying a sequence of WCA techniques having increasing complexity to circuits that fail less WCA assessments in accordance with embodiments of the invention.
Figure 5B:
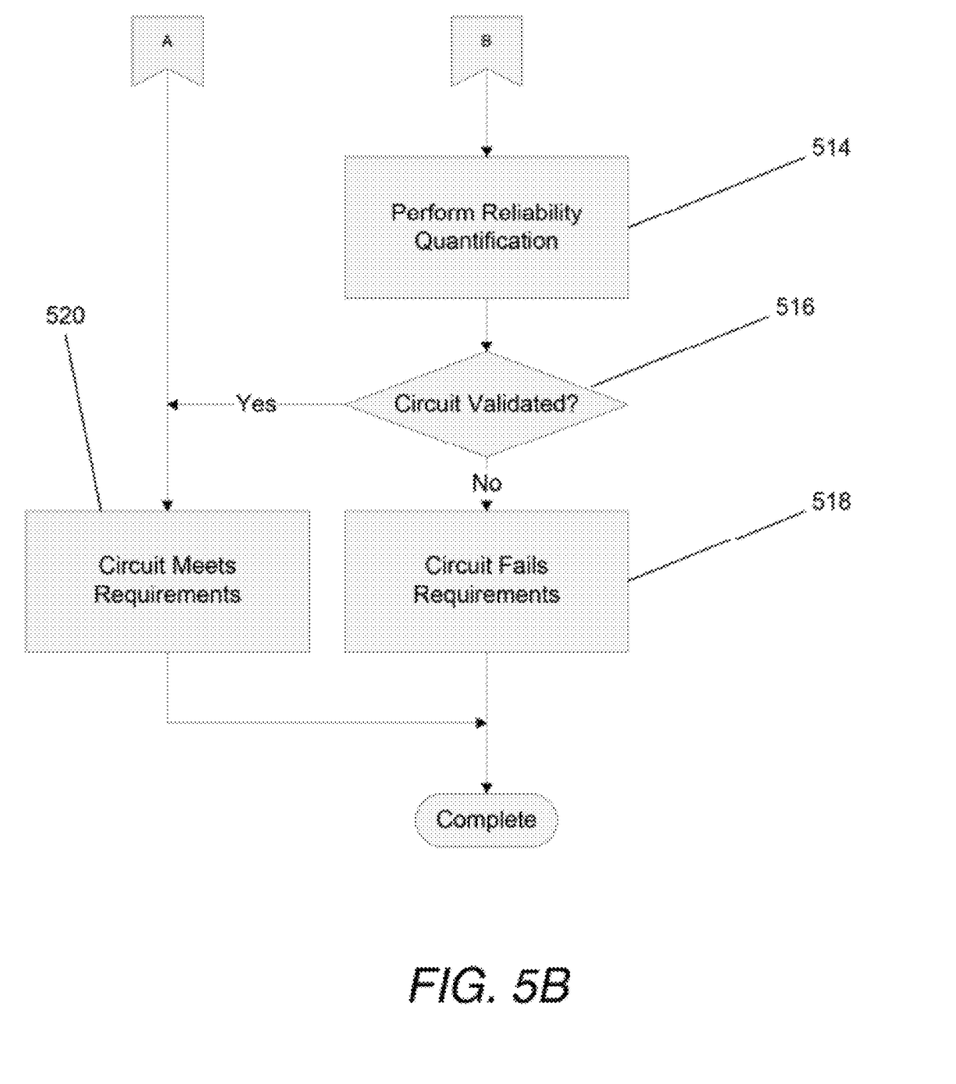

A process for applying various WCA approaches of increasing complexity in accordance with an embodiment of the invention is illustrated in FIGS. 5A and 5B. As indicated above, the process 500 involves performing (502) EVA first. If a determination (504) is made that the circuit does not pass EVA and a design or requirement change is not readily accomplished to result in an EVA pass, then Refined WCA is performed (506). The results of the Refined WCA provide a more accurate assessment of the performance bounds than EVA. If that second screen determines (508) that the circuit performs acceptably, then the process is complete (520). If the circuit still doesn't pass, then Monte Carlo WCA analysis is used (510) to pull the bounds in further. In many embodiments, predetermined criteria are defined for the Monte Carlo distribution to assess whether an acceptably small portion of the tails is beyond the circuit requirement. Monte Carlo WCA typically takes much more effort than Refined WCA. Finally, if Monte Carlo WCA determines (512) that the circuit does not meet its requirements, Reliability Quantification can be applied (514), expanding upon the work in the Monte Carlo WCA, to determine the actual expected performance range. Throughout the process, design or requirement changes may be implemented to make the design acceptable. In the event that a determination (516) is made that the circuit does not meet its operational requirements based upon the Reliability Quantification, then the circuit is finally determined to fail (518) to meet its operational requirements under WCA.

Although a specific process is illustrated in FIGS. 5A and 5B for performing WCA, any of a variety of alternative combinations of WCA analysis techniques can be utilized when performing CLA in accordance with embodiments of the invention.

While the above description contains many specific embodiments of the invention, these should not be construed as limitations on the scope of the invention, but rather as an example of one embodiment thereof. Accordingly, the scope of the invention should be determined not by the embodiments illustrated, but by the appended claims and their equivalents.

What is claimed:

1. A method of system lifetime evaluation, comprising:
iteratively performing Worst Case Analysis (WCA) on a system design with respect to different system lifetimes using a computer to determine the lifetime at which the worst case performance of the system indicates the system will pass with zero margin or fail within a predetermined margin for error given the environment experienced by the system during its lifetime;
wherein performing WCA on a system with respect to a specific system lifetime comprises:
identifying subcircuits within the system;
performing Extreme Value Analysis (EVA) with respect to each subcircuit to determine whether the subcircuit fails EVA for the specific system lifetime;
when the subcircuit passes EVA, determining that the subcircuit does not fail WCA for the specified system lifetime;
when a subcircuit fails EVA performing at least one additional WCA process that provides a tighter bound on the WCA than EVA to determine whether the subcircuit fails WCA for the specified system lifetime;
determining that the system passes WCA with respect to the specific system lifetime when all subcircuits pass WCA; and
determining that the system fails WCA when at least one subcircuit fails WCA.

2. The method of claim 1, wherein performing at least one additional WCA process that provides a tighter bound on the WCA than EVA to determine whether the subcircuit fails WCA for the specified system lifetime comprises performing a Refined Worst Case Analysis (Refined WCA) with respect to the subcircuit and the specified system lifetime.

3. The method of claim 2, wherein performing the Refined WCA with respect to the system and the specified system lifetime involves performing at least one of measuring the actual range of part parameter values for at least one lot of parts that are included in the system, measuring the values of the actual parts used in the system, or analyzing the thermal gradient within the system to determine whether the same extreme temperature limit should be applied to each part.

4. The method of claim 2, further comprising applying root sum squares (RSS) to random circuit parameters.

5. The method of claim 1, wherein performing at least one additional WCA process that provides a tighter bound on the WCA than EVA to determine whether the subcircuit fails WCA for the specified system lifetime comprises performing Monte Carlo Worst Case Analysis (Monte Carlo WCA) with respect to the subcircuit and the specified system lifetime.

6. The method of claim 5, wherein performing Monte Carlo WCA with respect to the system and the specified system lifetime comprises:
   determining a probability density function (PDF) for the performance of at least one part within a subcircuit given the environment experienced by the subcircuit during its lifetime;
   determining extreme part parameters for the at least one part based upon the PDF for the part; and
   performing WCA of the subcircuit based upon the extreme part parameters for at least one of the parts within the subcircuit.

7. The method of claim 6, wherein the PDF for a part's performance is generated by selecting random values based upon PDFs of environmental parameters at the point in the operational life of the circuit for which the reliability estimate is desired.

8. The method of claim 1, wherein performing at least one additional WCA process that provides a tighter bound on the WCA than EVA to determine whether the subcircuit fails WCA for the specified system lifetime comprises performing Reliability Quantification with respect to the subcircuit and the specified system lifetime.

9. The method of claim 8, wherein performing Reliability Quantification with respect to the system and the specified system lifetime comprises:
   determining a PDF for subcircuit performance by randomly sampling the PDFs of environmental parameters at the point in the operational life of the circuit for which the reliability estimate is desired and from derived PDFs for the part parameters; and
   determining subcircuit performance based upon the PDF for the subcircuit.

10. The method of claim 1, wherein performing at least one additional WCA process that provides a tighter bound on the WCA than EVA to determine whether the subcircuit fails WCA for the specified system lifetime comprises:
   performing a Refined WCA with respect to the subcircuit and the specified system lifetime;
   when the subcircuit passes Refined WCA, determining that the subcircuit does not fail WCA for the specified system lifetime; and
   when a subcircuit fails Refined WCA performing at least one additional WCA process that provides a tighter bound on the WCA than Refined WCA to determine whether the subcircuit fails WCA for the specified system lifetime.

11. The method of claim 10, wherein performing at least one additional WCA process that provides a tighter bound on the WCA than the Refined WCA to determine whether the subcircuit fails WCA for the specified system lifetime comprises:
   performing Monte Carlo WCA with respect to the subcircuit and the specified system lifetime;
   when the subcircuit passes Monte Carlo WCA, determining that the subcircuit does not fail WCA for the specified system lifetime; and
   when a subcircuit fails Monte Carlo WCA performing at least one additional WCA process that provides a tighter bound on the WCA than Monte Carlo WCA to determine whether the subcircuit fails WCA for the specified system lifetime.

12. The method of claim 11, wherein performing at least one additional WCA process that provides a tighter bound on the WCA than Monte Carlo WCA to determine whether the subcircuit fails WCA for the specified system lifetime comprises:
   performing Reliability Quantification with respect to the subcircuit and the specified system lifetime;
   when the subcircuit passes Reliability Quantification, determining that the subcircuit does not fail WCA for the specified system lifetime; and
   when a subcircuit fails Reliability Quantification determining that the subcircuit fails WCA for the specified system lifetime.

13. The method of claim 1, wherein performing WCA on a system with respect to a specific system lifetime further comprises obtaining part information with respect of the parts within the system and the scenario of the system.

14. The method of claim 13, wherein the information concerning the operating scenario of the system includes information concerning the environment experienced by the circuit during its lifetime.

15. The method of claim 1, wherein WCA considers at least one parameter selected from the group consisting of aging, radiation, temperature, initial tolerance, bias, and annealing.

16. The method of claim 1, further comprising identifying at least one subcircuit that limits the system lifetime.

17. The method of claim 16, wherein identifying at least one subcircuit that limits the circuit lifetime comprises:
   selecting each subcircuit and holding the function of the subcircuit constant while the other subcircuits can vary;
   iteratively performing Worst Case Analysis (WCA) with respect to different system lifetimes using a computer to determine the lifetime at which the worst case performance of the system indicates the system will pass with zero margin or fail within a predetermined margin for error given the environment experienced by the system during its lifetime; and
   identifying at least one subcircuit that limits the system lifetime based upon the increase in system lifetime that occurs when the subcircuit is assumed not to fail.

18. The method of claim 17, further comprising identifying at least one part within the subcircuit that limits the subcircuit lifetime.

19. The method of claim 18, further comprising identifying at least one part parameter with respect to a specific part in the subcircuit that limits the subcircuit lifetime.

20. A system configured to evaluate the lifetime of a system, comprising:
   a computer configured to iteratively perform Worst Case Analysis (WCA) on a system design with respect to different system lifetimes to determine the lifetime at which the worst case performance of the system indicates the system will pass with zero margin or fail within a predetermined margin for error given the environment experienced by the system during its lifetime;

wherein performing WCA on a system with respect to a specific system lifetime comprises:

identifying subcircuits within the system;

performing Extreme Value Analysis (EVA) with respect to each subcircuit to determine whether the subcircuit fails EVA for the specific system lifetime;

when the subcircuit passes EVA, determining that the subcircuit does not fail WCA for the specified system lifetime;

when a subcircuit fails EVA performing at least one additional WCA process that provides a tighter bound on the WCA than EVA to determine whether the subcircuit fails WCA for the specified system lifetime;

determining that the system passes WCA with respect to the specific system lifetime when all subcircuits pass WCA; and determining that the system fails WCA when at least one subcircuit fails WCA.

* * * * *